(12) United States Patent
Shibata

(10) Patent No.: US 6,168,891 B1
(45) Date of Patent: Jan. 2, 2001

(54) METHOD FOR CORRECTING MASK PATTERN FOR USE IN MANUFACTURING OF SEMICONDUCTOR INTEGRATED CIRCUIT

(75) Inventor: Hidenori Shibata, Osaka (JP)

(73) Assignee: Matsushita Electric Industrial Co., Ltd., Kadoma (JP)

( * ) Notice: Under 35 U.S.C. 154(b), the term of this patent shall be extended for 0 days.

(21) Appl. No.: 09/449,569

(22) Filed: Nov. 29, 1999

(30) Foreign Application Priority Data

Nov. 30, 1998 (JP) .................................................. 10-339447

(51) Int. Cl.[7] ........................................................ G03F 9/00
(52) U.S. Cl. .................................................. 430/30; 430/5
(58) Field of Search .............................................. 430/30, 5

(56) References Cited

U.S. PATENT DOCUMENTS

| | | | |
|---|---|---|---|
| 5,657,235 | 8/1997 | Liebmann et al. | 364/474.24 |
| 5,705,301 | 1/1998 | Garza et al. | 430/5 |
| 5,740,068 | 4/1998 | Liebmann et al. | 364/489 |
| 5,879,844 | 3/1999 | Yamamoto et al. | 430/30 |
| 5,900,338 | 5/1999 | Garza et al. | 430/5 |

*Primary Examiner*—Christopher G. Young
(74) *Attorney, Agent, or Firm*—Jacobson, Price, Holman & Stern, PLLC

(57) ABSTRACT

A method for correcting a mask pattern for use in manufacturing of a semiconductor integrated circuit according to the invention comprises the steps of: sorting pattern units which compose a mask pattern, based on their respective shape and/or relative positional relationship with adjacent pattern units; selectively performing pattern correction on some of the pattern units which have been sorted out at the sorting step.

18 Claims, 5 Drawing Sheets

F I G. 9
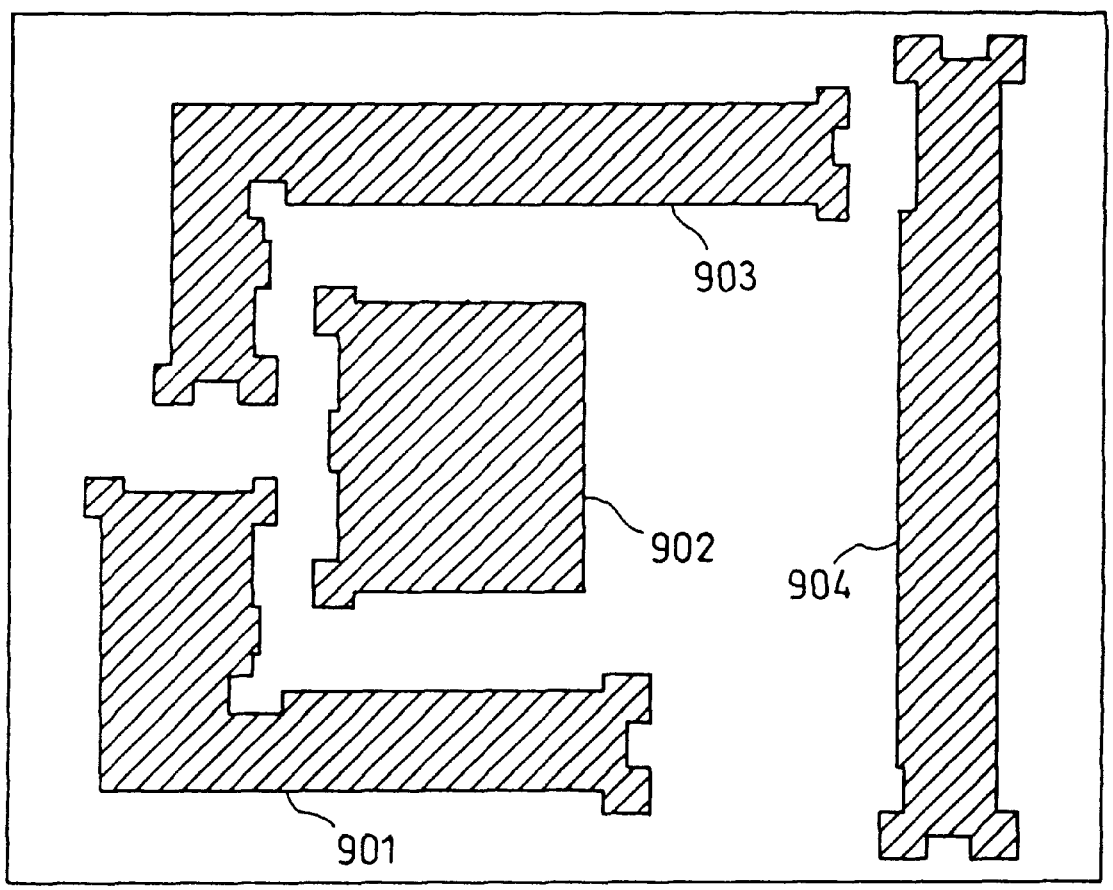

METHOD FOR CORRECTING MASK PATTERN FOR USE IN MANUFACTURING OF SEMICONDUCTOR INTEGRATED CIRCUIT

BACKGROUND OF THE INVENTION

1. Field of the Invention

The invention relates to a method for correcting a mask pattern for use in the manufacturing of semiconductor integrated circuits (ICs) and, more particularly to, a method for improving the accuracy of an image on lithography by Reactive Ion Etching (hereinafter abbreviated as RIE) during the manufacturing of elements of semiconductor ICs, by using such a correction method as an Optical Proximity effect Correction (hereinafter abbreviated as OPC) method.

2. Description of the Related Art

A mask pattern for use in the manufacturing of semiconductor ICs (hereinafter abbreviated as mask pattern) is configured as a composite of a plurality of pattern units which correspond to each wiring etc. The mask pattern is made by use of a CAD procedure for designing of semiconductor mask layout and then replicated on the surface of each substrate according to a series of various steps of photolithography or RIE.

A mask pattern is subject to fine patterning for the purpose of improving the performance of semiconductor ICs. A mask pattern, thus finely patterned, has its own pattern units as close as possible to each other, so that an image projected through the mask pattern onto a substrate has also its component image units (which corresponds to the pattern units) as close as possible to each other. Therefore, an electron beam applied through the mask pattern onto a substrate and then reflected from it has such an effect that an apparent exposure would increase in a region where these pattern units are close to each other, thus making it difficult to project fine images. That is, an image given as a result of projection through a mask pattern is subject to deformation in shape from or fluctuation in size of the mask pattern. This is so-called the Optical Proximity Effect.

Such deformation or size-wise fluctuations of a project image will make it difficult to perform an expected patterning in strict accordance with a mask pattern, so that some correction should be made against the above-mentioned optical proximity effect. A method for performing this correction is an OPC method.

The OPC method may comprise such a step of shifting sides of each of pattern units which compose a mask pattern, to deform the shape of the pattern unit beforehand so that the shape may be biased selectively. Depending on how to determine a bias amount, such OPC method comes in two known general methods of a simulation-based OPC (hereinafter called S-OPC) method and a rule-based OPC (hereinafter called R-OPC) method.

The S-OPC method would subdivide each side of a pattern unit to perform simulation in term of light-intensity in order to extract a shape-wise difference between the original pattern unit and the one having deformation and size-wise fluctuations given as a result of this simulation, based on the results of which extraction, a bias amount may be determined for each side of the pattern unit. Since the S-OPC method subdivides each side of a pattern unit for light-intensity simulation, it is possible to reproduce the shape of the pattern unit through a photo-mask very accurately.

The R-OPC method uses as a basis such attributes of a pattern unit as its size and shape as well as a proximate situation with adjacent one etc., to determine a bias amount for each side of the pattern unit, so that its each side may be biased according to thus determined bias amount.

Both of the OPC methods, however, suffer from the following respective disadvantages. The S-OPC method performs simulation for each side of a pattern unit, thus requiring a great deal of time for its computational processing. Also, since the shape of a pattern unit is generally stored in the values of coordinates of each side or vertex of a pattern unit, the pattern unit after being corrected is subject to deformation upon each side as subdivided. Therefore, the amount of data required to record the shape of a pattern unit after correction is much larger than that required before correction.

To eliminate this disadvantage, the S-OPC method may well provide a certain limit to the subdivision of each side. Having done so, however, such an event may happen that a pattern accuracy cannot be secured when a semiconductor IC is formed using pattern units as having undergone S-OPC.

The R-OPC method, on the other hand, does not perform light-intensity simulation, permitting high speed computational processing as compared to the S-OPC method. Also, since the R-OPC method does not deform each side of a pattern unit by subdivision during correction, it only requires a smaller amount of data in recording of a pattern unit shape than the S-OPC method. However, in order to perform a high-accuracy R-OPC operation for an ever diversifying pattern unit, it is necessary to set finely such items as pattern unit size and shape as well as its positional situation with peripheral ones which are used to determine a bias amount. To meet such a requirement, complex computational algorithm must be used in performing of the R-OPC method, which leads to increases in the amount of time and data for OPC computational processing, thus suppressing the advantages of the R-OPC method over the S-OPC method.

Thus, when S-OPC is performed, the as-finished accuracy is indeed improved for semiconductor ICs but the processing time and the data amount required are greatly increased. If R-OPC is performed, on the other hand, the required processing time and data amounts indeed suppressed but the as-finished accuracy for semiconductor ICs is deteriorated.

With this, conventionally, to eliminate the above-mentioned disadvantages inherent to the OPC methods, such a correction method as Laid-Open Patent Application No. Hei8-286358 has been proposed.

According to this correction method, before OPC is performed, such graphic logical operational processing in a broad sense as contraction and expansion of graphics as well as deletion of overlaps between adjacent graphics themselves is carried out to extract pattern units subject to OPC processing, so that thus extracted pattern units may undergo either the R-OPC or S-OPC methods so as to enjoy the advantages of both of them.

In such a prior art also, however, graphic logical operational processing is performed step-wise to extract pattern units on which OPC is to be carried out, so that it suffers from a problem of increasing the number of steps of the graphic logical operational processing. Moreover, for each step of the graphic logical operational processing, a data set containing the pattern units is read in to perform the graphic logical operational processing, thus outputting the results as a new data set, so that each file requires processing for many times of its read-in operation, thus increasing the processing time for the extraction of patterns required for the performing of OPC, which makes it difficult to reduce the time for processing.

Furthermore, such a pattern unit as not being rectangular must be divided, thus making incorrect the results of correcting a boundary portion between thus divided pattern units adjacent to each other.

SUMMARY OF THE INVENTION

In view of the above, it is the main object of the invention to provide a method for correcting a mask pattern for semiconductor ICs which is able to efficiently extract pattern units subject to OPC processing rapidly and accurately correct thus extracted pattern units.

The other objects, features, and advantages of the invention will be apparent from the following description.

The first aspect of the invention is, in short, a method for correcting mask patterns for semiconductor ICs, comprising the steps of: a sorting step of sorting pattern units composing a mask pattern based on their respective shapes and/or their proximate relative positional relationships; and a correction step of select some of the above-mentioned sorted pattern units and correcting them.

The second aspect of the invention is a method for correcting mask patterns for semiconductor ICs, comprising the steps of: a sorting step of sorting the component sides of pattern units composing a mask pattern based on their respective shapes and/or their proximate relative positional relationships; and a correction step of correcting selectively performing pattern correction on some of thus sorted sides.

Such a scheme will extract pattern units or their sides subject to correction based on their inherent characteristics such as the width, length, etc. of their component sides and their relationships with the adjacent pattern units as well as inter-side distances and other relative positional relationships, thereby making it possible to perform correction at a higher speed than the conventional methods where pattern units subject to correction are extracted by the graphic logical operational processing.

Furthermore, the method according to the present method performs optimal pattern correction on each pattern unit or side or decides whether it would perform it or not based on the shapes of each pattern unit or side as well as the positional relationship between these pattern units or sides, it can select the optimal pattern correction based on the characteristics peculiar to each pattern unit or side. Therefore, the present method can secure a pattern accuracy when a semiconductor IC is formed using such mask patterns as-corrected.

Still furthermore, even with such a pattern unit as not being rectangular, for example a polygonal pattern unit having five vertices or more, the method according to the invention can use each side and its shapes around each vertex as a criterion for performing pattern correction, thus accurately performing pattern correction on the vertices of a pattern unit and each of its component sides.

BRIEF DESCRIPTION OF THE DRAWINGS

These and other objects as well as advantages of the invention will become clear by the following description of preferred embodiments of the invention with reference to the accompanying drawings, wherein:

FIG. 9 shows a mask pattern obtained by performing OPC processing on the mask pattern shown in FIG. 8 according to the flowchart shown in FIG. 6.

In all these figures, like components are indicated by the same numerals.

DETAILED DESCRIPTION OF THE INVENTION

Figure 1:
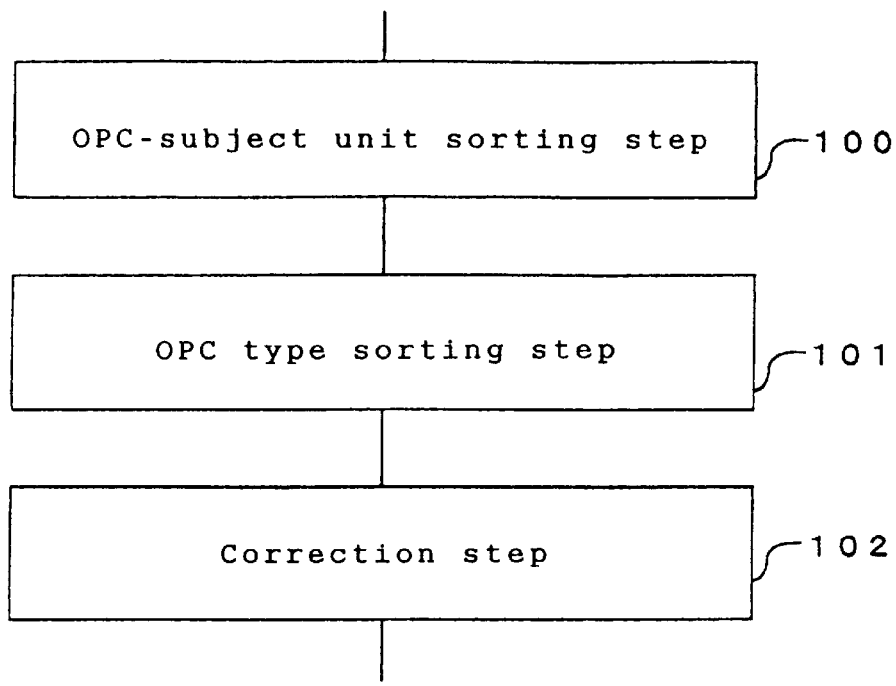
FIG. 1 is a flowchart showing a correction method according to the first embodiment of the invention for a mask pattern used in the manufacturing of semiconductor ICs.

First, the first embodiment of the invention is described with reference to FIG. 1 as follows.

A numeral 100 indicates a step of sorting units subject to OPC, where the shape of each of pattern units composing a mask pattern, specifically a width $\alpha$ of each pattern unit (which may be of either a longer or shorter side and is hereinafter abbreviated as width $\alpha$) and a distance $\beta$ between adjacent pattern units (hereinafter abbreviated as distance $\beta$) are calculated, to compare between calculated values of width $\alpha$ and of distance $\beta$ as well as between the first value $\alpha$sh1 and the second value $\beta$sh2.

These first and second values $\alpha$sh1 and $\beta$sh2 are threshold values which are set based on such factors as the lithographic processing or the RIE processing. Specifically, these first and second values $\alpha$sh1 and $\beta$sh2 function as reference values in such a way that the size of a semiconductor IC fluctuates greatly if the width $\alpha$ is set at the first value $\alpha$sh1 or below or if the distance $\beta$ is set at the second value $\beta$sh2 or below.

If, for example, the width $\alpha$ or the distance $\beta$ becomes 0.25 $\mu$m or below when the wavelength of a light source used for exposure of masks is 0.264 $\mu$m, the accuracy of an image during or after lithographic processing or RIE processing deteriorates greatly. To guard against this, based on the results of the above-mentioned comparison, those pattern units with the width $\alpha$ being smaller than the first value $\alpha$sh1 (i.e., $\alpha < \alpha$sh1) are sorted out and output. Also, those pattern units with the distance $\beta$ being smaller than the second value $\beta$sh2 (i.e., $\beta < \beta$sh2) are sorted out and output as pattern units subject to OPC (hereinafter referred to as correction-subject units). Those pattern units which are not sorted at the step 100 are sorted as pattern units not subject to OPC (hereinafter referred to as subject units).

A numeral 101 indicates a step for sorting OPC types, wherein correction-subject units output at the step 100 are further sorted into those correction-subject units which undergo S-OPC and those which undergo R-OPC, based on values of the width $\alpha$ and the distance $\beta$, which are sorting factors used at the step 100.

More specifically, for the input correction-subject unit, its width $\alpha$ and the third value $\alpha$sh3 are compared to each other.

Then, for that input correction-subject unit, the distance $\beta$ and the fourth value $\beta sh4$ are compared to each other.

The third and fourth values $\alpha sh3$ and $\beta sh4$ are, like the first and second values $\alpha sh1$ and $\beta sh2$, threshold values which are set based on such factors as the lithographic or RIE processing. The third value $\alpha sh3$ is supposed to be smaller than the first value $\alpha sh1$ (i.e., $\alpha sh3<\alpha sh1$) and the fourth value $\beta sh4$, smaller than the second value $\beta sh2$ (i.e., $\beta sh4<\beta sh2$).

If, as a result of comparison between them, it is decided that the width $\alpha$ is smaller than the third value $\alpha sh3$ (i.e., $\alpha<\alpha sh3<\alpha sh1$) correction-subject units having that width $\alpha$ are sorted out and output as correction-subject units, which undergo S-OPC. Similarly, if the distance $\beta$ is smaller than the fourth value $\beta sh4$ (i.e., $\beta<\beta sh4<\beta sh2$), the relevant correction-subject units are sorted out and output as correction-subject units, which undergo S-OPC. If, furthermore, an input width $\alpha$ is larger than the third value $\alpha sh3$ (i.e., $\alpha sh3<\alpha<\alpha sh1$) and, at the same time, an input distance $\beta$ is larger than the fourth value $\beta sh4$ (i.e., $\beta sh4<\beta<\beta sh2$), the relevant correction-subject units are sorted out and output as correction-subject units, which undergo R-OPC.

As mentioned above, whether to perform S-OPC or R-OPC is decided on the following reason:

When a correction-subject unit having a width $\alpha$ not larger than the third value $\alpha sh3$ or a distance $\beta$ not larger than the fourth value $\beta sh4$ is projected onto a substrate to form a pattern, the size of the resultant semiconductor IC fluctuates greatly, changing nonlinearly. That is, the bias amount for a correction-subject unit increases with the decreasing value of the relevant width $\alpha$ or the distance $\beta$. If, for example, the distance $\beta$ decreases to a certain value (e.g., 0.20 $\mu$m) or less, the bias amount must be decreased conversely, because otherwise, the pattern units may come in mutual contact. For this reason, it is inevitable that the optimal bias amount may fluctuate depending on the value of the distance $\beta$.

In order to indiscriminately perform R-OPC as OPC for the purpose of compensating for such fluctuations in the size of elements, complicated processing is necessary in which the value of the bias amounts finely set based on a width $\alpha$. For this reason, the time required for performing the R-OPC processing becomes greatly large, thus eliminating the merits. In such a case, therefore, S-OPC is better because it requires less time to perform OPC.

A numeral 102 indicates a step for correction, at which based on the results of decision made on each correction-subject unit at the step 101, S-OPC or R-OPC is performed on that correction-subject unit and then the correction results are output.

The step 102 is described specifically as follows.

Figure 2:
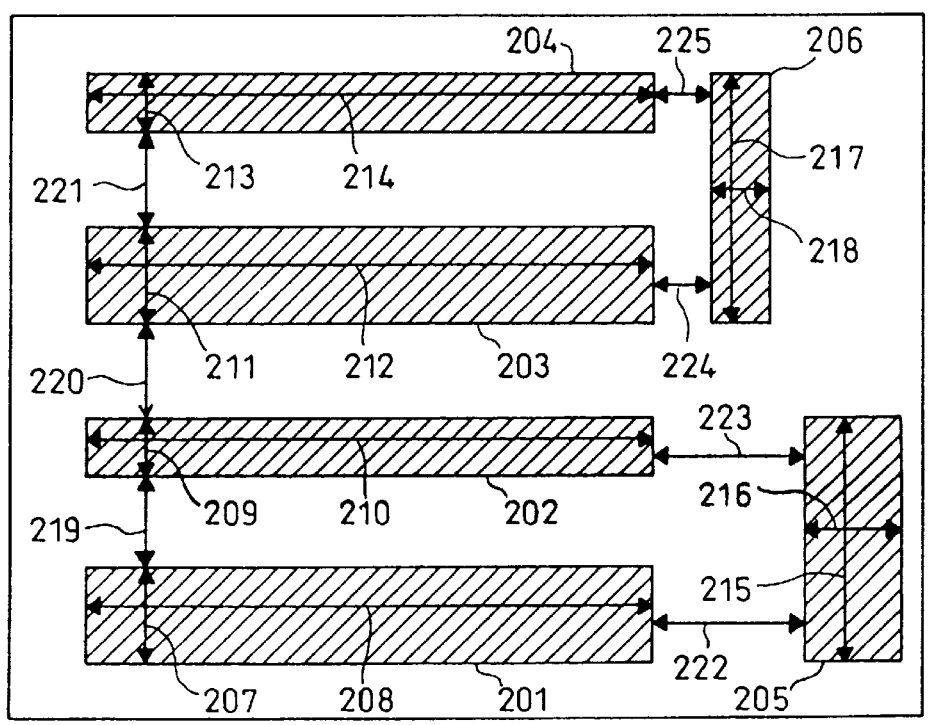
FIG. 2 shows an example of a semiconductor-IC mask pattern subject to correction in the first embodiment of the invention.

In FIG. 2, numerals 201–206 indicate pattern units and numerals 207–218, the width $\alpha$ of each of the pattern units 201–206. Also, numerals 219–225 indicate the distance $\beta$ between the pattern units 201–206. Of these, the numeral 219 indicates a distance $\beta$ between the pattern units 201 and 202, a numeral 220 indicates a distance $\beta$ between the pattern units 202 and 203, a numeral 221 indicates a distance $\beta$ between the pattern units 203 and 204, a numeral 222 indicates a distance $\beta$ between the pattern units 201 and 205, a numeral 223 indicates a distance $\beta$ between the pattern units 202 and 205, a numeral 224 indicates a distance $\beta$ between the pattern units 203 and 206, and a numeral 225 indicates a distance $\beta$ between the pattern units 204 and 206.

Figure 3:
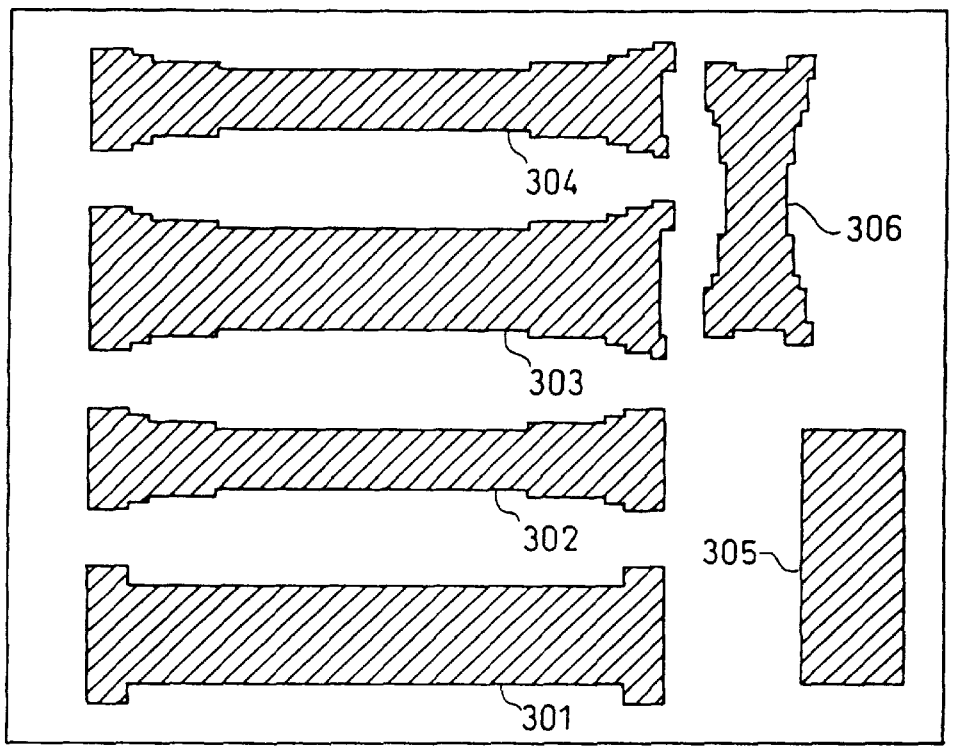
FIG. 3 shows a mask pattern given when the mask pattern shown in FIG. 2 is corrected according to the flowchart shown in FIG. 1.

In FIG. 3, numerals 301–306 indicate the respective pattern units after being corrected, each corresponding to the pattern units 201–206 in FIG. 2 respectively.

Figure 4:
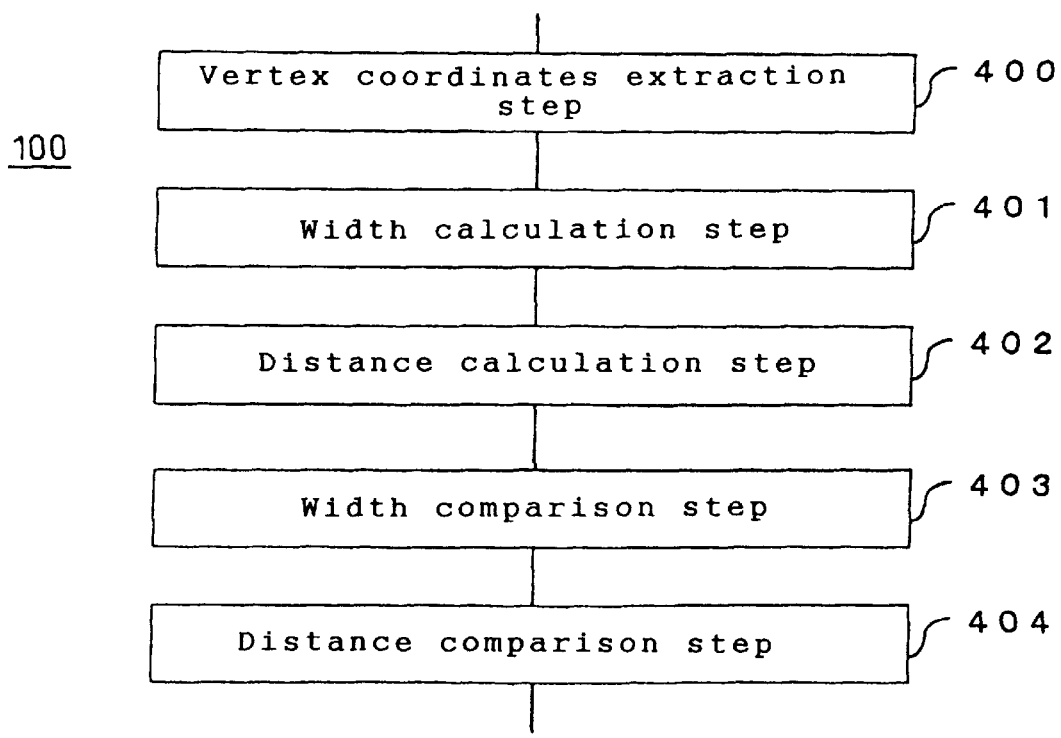
FIG. 4 is a flowchart showing specific operations for a step of sorting pattern units, of the flowchart shown in FIG. 1.

In FIG. 4, a numeral 400 indicates a step of extracting vertex coordinates, at which the vertex coordinates of each pattern unit is extracted.

A numeral 401 indicates a step of calculating a width, at which based on the vertex coordinates of each pattern unit extracted at the step 400, a width $\alpha$ of the pattern unit is calculated.

A numeral 402 is a step of calculating a distance, at which based on the vertex coordinates of each pattern unit extracted at the step 400, a distance $\beta$ between the adjacent pattern units is calculated.

A numeral 403 indicates a step of comparing the width, at which a width $\alpha$ calculated at the step 401 is compared to the first value $\alpha sh1$ and, if the width $\alpha$ is smaller than the first value $\alpha sh1$ (i.e., $\alpha<\alpha sh1$), those pattern units having that width $\alpha$ are sorted out as correction-subject units with greatly fluctuating sizes of semiconductor ICs.

A numeral 404 indicates a step of comparing the distance, at which a distance $\beta$ calculated at the step 402 is compared to the second value $\beta sh2$ and, if the distance $\beta$ is smaller (i.e., $\beta<\beta sh2$) those pattern units having that distance $\beta$ are sorted out as correction-subject units with greatly fluctuating sizes of semiconductor ICs.

Figure 5:
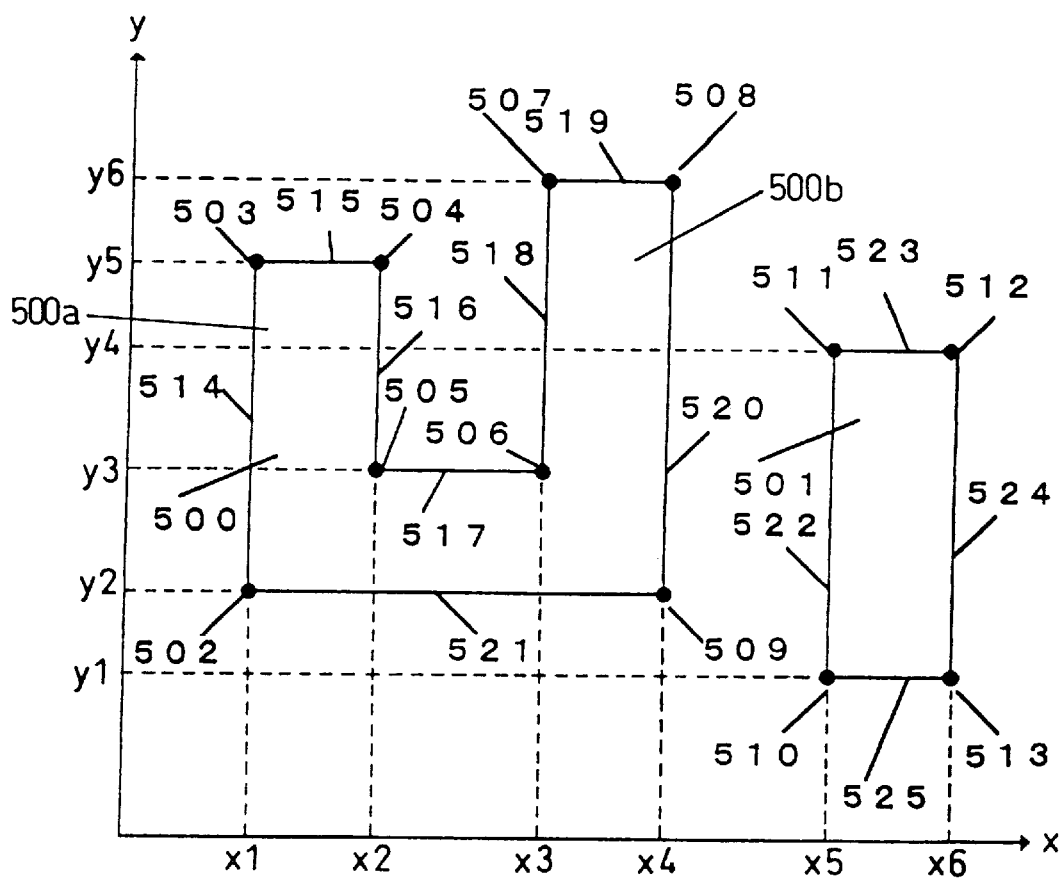
FIG. 5 is a graph for explaining operations according to the flowchart shown in FIG. 4.

In FIG. 5, numerals 500 and 501 indicate mutually adjacent two pattern units, numerals 502–509 indicate the vertices of one pattern unit 500, while numerals 510–513 indicate the vertices of the pattern unit 501. Numerals 514–521 indicate the sides which compose one pattern unit 500, while numerals 522–525 indicate the sides which compose the other pattern unit 501.

In terms of coordinates, the vertex 502 is indicated as (x1, y2), the vertex 503 is indicated as (x1, y5), the vertex 504 is indicated as (x2, y5), the vertex 505 is indicated as (x2, y3), the vertex 506 is indicated as (x3, y3), the vertex 507 is indicated as (x3, y6), the vertex 508 is indicated as (x4, y6), the vertex 509 is indicated as (x4, y2), the vertex 510 is indicated as (x5, y1), the vertex 511 is indicated (x5, y4), the vertex 512 is indicated as (x6, y4), and the vertex 513 is indicated as (x6, y1).

Figure 6:
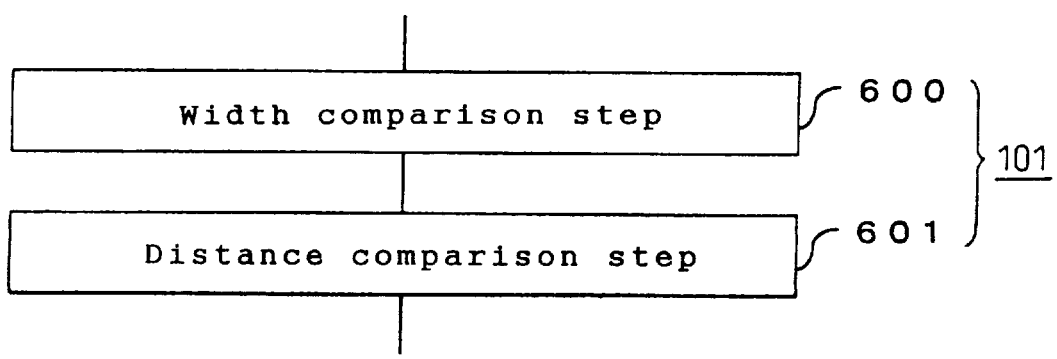
FIG. 6 is a flowchart showing specific operations for a step of deciding whether to perform correction, of the flowchart shown in FIG. 1.

In FIG. 6, a numeral 600 indicates a step of comparing the width, at which a width $\alpha$ of the correction-subject unit calculated at the step 401 is compared to the third value $\alpha sh3$ and, if the width $\alpha$ is smaller than the third value $\alpha sh3$ (i.e., $\alpha<\alpha sh3<\alpha sh1$), those correction-subject units having that width $\alpha$ are sorted out and output as correction-subject units, which undergo S-OPC. If the width $\alpha$ falls between the first value $\alpha sh1$ and the third value $\alpha sh3$ (i.e., $\alpha sh1<\alpha<\alpha sh3$), those correction-subject units having that width $\alpha$ are sorted out and output as correction-subject units, which undergo R-OPC.

A numeral 601 indicates a step of comparing the distance, at which a distance $\beta$ of the correction-subject unit calculated at the step 402 is compared to the fourth value $\beta sh4$ and, if the distance $\beta$ is smaller than the fourth value $\beta sh4$ (i.e., $\beta<\beta sh4<\beta sh2$), those correction-subject units having that distance $\beta$ are sorted out and output as correction-subject units, which undergo S-OPC.

If the distance $\beta$ falls between the second value $\beta sh2$ and the fourth value $\beta sh4$ (i.e. $\beta sh2<\beta<\beta sh4$), those correction-subject units having that distance $\beta$ are sorted out and output as correction-subject units, which undergo R-OPC.

The above scheme is more detailed as follows.

First, a layout of a mask pattern (see the example shown in FIG. 2) for semiconductor ICs which is created beforehand is input at the step 100. At the step 100, first, for the pattern units 201–206 which compose the mask pattern, their widths 207–218 and the distance between themselves 219–225 are calculated. Then, in order to sort for example one pattern unit 201 as for whether to perform OPC or not, the widths 207 and 208 are compared to the first value αsh1 and also the distances 219 and 222 are compared to the second value βsh2. If, in this case, the width 207 or 208 is smaller than the first value αsh1 or the distance 219 or 222 is smaller than the second value βsh2, the pattern unit 201 is output as a correction-subject unit. Subsequently, at the step 100 the other pattern units 202–206 also undergo calculations of the width and their mutual distance β as well as their comparison to the first value αsh1 and the second value βsh2.

The comparison results here are supposed to be as follows. That is, the patter unit 202 has its width 209 smaller than the first value αsh1 and its distances 219 and 220 smaller than the second value βsh2. The pattern unit 203 has its distances 220, 221, and 224 smaller than the second value βsh2. The pattern unit 204 has its width 213 smaller than the first value αsh1 and its distances 221 and 225 smaller than the second value βsh2. The pattern unit 205 has its widths 215 and 216 smaller than the first value αsh1 and its distances 222 and 223 smaller than the second value βsh2. The pattern unit 206 has its width 218 smaller than the first value αsh1 and its distances 224 and 225 smaller than the second value βsh2.

Supposing as above, at the step 100, all the pattern units of 201–204 and 206 except 205 are sorted out as correction-subject units.

With reference to FIGS. 4 and 5, the operations at the step 100 are more specifically described below.

At the step 400, the coordinates of each vertex of the pattern unit are extracted. When, for example, two pattern units 500 and 501 shown in FIG. 5 are input to the step 400, the system extracts the value of coordinates for each of vertices 502–513 for each of the pattern units 500 and 501.

Next, at step 401, the system calculates both x-axial and y-axial width A of each of the pattern units 500 and 501. Note here that in a typical layout data format (e.g., GDSII data format), a pattern unit is expressed in coordinates of each of its vertices, thus tracing the vertices starting from the starting point through the end point which is the same as that starting point according to a so-called one-shot writing procedure (clockwise direction in this example). Therefore, the vortex coordinates of each pattern unit are expressed as follows. That is, the patter unit 500 is expressed in an order of 502 (x1, y2)→503(x1, y5)→504(x2, y5)→505(x2, y3)→506(x3, y3)→507 (x3, y6)→508(x4, y6)→509(x4, y2)→502(x1, y2). The pattern unit 501, on the other hand, is expressed in an order of 510(x5, y1)→511 (x5, y4)→512 (x6, y4)→513 (x6, y1)→510(x5, y1).

The horizontal width of each pattern unit is calculated as follows. Here, a pattern unit 500 is exemplified. That is, first, if the x coordinate value of one vertex of the pattern unit 500 is the same as that of the next one, the sides which exist between these two vertices, that is, sides 514, 516, 518, and 520 parallel to the y-axis are extracted. Then, thus extracted sides are rearranged in an ascending order of the x coordinates value, to calculate a distance between a side, of thus rearranged sides, whose end point's y coordinates is larger than its starting point's y coordinates (i.e., side having a clockwise and upward vector) and another side whose x coordinates is larger than that of the former one and which is the closest to that former one and also whose end point's y coordinates is smaller than its starting point's y coordinates (i.e., side having a clockwise and downward vector).

As for a side 514, a side 516 corresponds to the above-mentioned side; and as for a side 518, a side 520 corresponds to it. The horizontal widths of the pattern unit 500, therefore, are determined as a distance x2-x1 between the sides 514 and 516 and another distance x4-x3 between the sides 518 and 520.

The vertical width of the pattern unit is calculated as follows. Here, the pattern unit 500 is exemplified. That is, first, if the y coordinate value of one vertex of the pattern unit 500 is the same as that of the next one, the sides which exist between these two vertices, that is, sides 517 and 521 which are parallel to the x-axis are extracted. Then, thus extracted sides are rearranged in an ascending order of the x coordinates value, to calculate a distance between a side, of thus rearranged sides, whose end point's y coordinates is smaller than its starting point's y coordinates (i.e., side having a clockwise and leftward vector) and another side whose y coordinates is larger than that of the former one and which is the closest to that former one and also whose end point's x coordinates is larger than its starting point's x coordinates (i.e., side having clockwise and rightward).

That is, as for the side 521, the side 517 corresponds to the above-mentioned side. Therefore, the vertical width α of the pattern unit 500 is obtained as a distance y2-y3 between sides 521 and 517.

Next, at the step 402, a distance between mutually adjacent pattern units is calculated. Here the pattern units 500 and 501 are exemplified. Note here that the pattern unit 500 has a plurality unit regions 500a and 500b which are parallel to each other. The invention, therefore, regards a distance between these unit regions 500a and 500b also as the above-mentioned distance β and calculates it.

First, if the x coordinate value of a vertex, among those of the pattern units 500 and 501, is the same as that of the next one, the sides which exist between these two vertices, that is, sides 514, 516, 518, 520, 522, and 524 which are parallel to the y-axis are extracted. Then, thus extracted sides are rearranged in an ascending order of the y coordinate value, to calculate a distance between a side, of thus rearranged sides, whose end point's y coordinates is smaller than its starting point's y coordinates (i.e., side having a clockwise and downward vector) and another side whose x coordinates is larger than that of the former one and which is the closest to the former one and also whose end point's y coordinates is larger than its starting point's y coordinates (i.e., side having clockwise and upward vector).

As for the side 516, the side 518 corresponds to the above-mentioned side; and as for the side 520, the side 522 corresponds to it. Therefore, distances β between the sides 500 and 501 are obtained as a distance x3-x2 between the sides 516 and 518 and another distance x5-x4 between the sides 520 and 522.

Next, at the step 403, a width calculated at the step 401 is compared to the first value αsh1 and, if the width α is smaller than the first value αsh1, those pattern units having that width α are sorted out as correction-subject units and output. That is, if the width α is smaller than the first value αsh1, the relevant patterns will have a large fluctuation in size when they are projected onto a substrate. With this, at the step 403, those pattern units expected to have greatly large fluctuations in projection size are sorted out as correction-subject units and output.

Next, at the step 404, a distance β calculated at the step 402 is compared to the second value βsh2 and, if the distance β is smaller than the second value βsh2, those pattern units having that distance β are sorted out as correction-subject units and output. That is, if the distance β is smaller than the second value βsh2, the relevant pattern units will have greatly large fluctuations in size when they are projected onto a substrate. Therefore, at the step 404, those pattern units expected to have greatly large fluctuations in projection size are sorted out as correction-subject units and output.

The above-mentioned processing of the step 100 thus sorts out all pattern units as correction-subject units and subject units.

The correction-subject units 201–204 and 206 output from the step 100 are input to the step 101.

At the step 101, based on the shape (width α) and the relative relationship with other pattern units (distance β) of each correction-subject unit calculated at the step 100, the correction-subject units are sorted out as correction-subject units which undergo S-OPC and those which undergo R-OPC and output.

The operations at the step 101 are specifically described with reference to FIG. 6.

First, at the step 600, the correction-subject units 201–204 and 206 output from the step 100 are input, so that they may undergo comparison between a width α calculated at the step 401 and the third value αsh3. If the width α is smaller than the third value αsh3 (i.e., α<αsh3<αsh1), those correction-subject units having that width α are output as correction-subject units which undergo S-OPC. It is here supposed for example that the widths 209, 214, and 218 respectively of the correction-subject units 202, 204, and 206 of those correction-subject units 201–204 and 206 input at the step 600 are all smaller than the third value αsh3. In such a case, those correction-subject units 202, 204, and 206 are sorted out and output as correction-subject units which undergo S-OPC. The remaining correction-subject units 201 and 203 undergo such processing as described below at the next step 601 of comparing the distance.

That is, at the step 601, for the correction-subject units 201 and 203, which are output at the step 600 as those pattern units which will not undergo S-OPC, the distance β is compared to the fourth value βsh4 and, if the distance β is smaller than the fourth value βsh4 (i.e., β<βsh4<βsh2), those correction-subject units having that distance β are sorted out and output as correction-subject units which undergo S-OPC. If, for example, the distance 224 for the pattern unit 203 of those correction-subject units 201 and 203 input, is smaller than the fourth value βsh4 (i.e., β<βsh4), that correction-subject unit 203 is sorted out and output as a correction-subject unit which undergoes S-OPC. If, on the other hand, the distances 219 or 222 for the correction-subject unit 201 is larger than the fourth value βsh4 (i.e., βsh4<β<βsh2), that correction-subject unit 201 is sorted out and output as a correction-subject unit which undergoes R-OPC.

As mentioned above, in the first embodiment, at the step 101, of the pattern units 201–204 and 206 sorted as correction-subject units, the pattern units 202–204 and 206 are sorted out as correction-subject units which undergo S-OPC. Also, the pattern unit 201 is sorted out as a correction-subject unit which undergoes R-OPC.

Finally, at the step 102, S-OPC is performed on the pattern units 202–204 and 206 output as correction-subject units for S-OPC, to output pattern units 302–304 and 306 shown in FIG. 3. At the step 102, also, R-OPC is performed on the patter unit 201 output as a correction-subject unit for R-OPC, to output a pattern unit 301 shown in FIG. 3.

At the step 100, on the other hand, the pattern unit 205 sorted out as an subject unit does not undergo OPC, to be output as a pattern unit 305 with having unchanged shape of the pattern unit 205.

The detailed description of the specific processing of the S-OPC and R-OPC is omitted here, because they are already known.

As mentioned above, in the first embodiment, based on the shape of each pattern unit and its relative positional relationships with the proximate one, the pattern units contained in a mask pattern are sorted into correction-subject units and a subject units, to perform OPC only on those pattern units thus sorted out as correction-subject units, thus reducing the number of pattern units which undergo OPC so as to improve the processing speed, as compared to the case where all pattern units undergo OPC.

Moreover, since the first embodiment extracts correction-subject units and performs OPC processing only on thus extracted units not the entire mask pattern, it can reduce the number of accessing times involved in read-in operations to the file set, thus further improving the speed of pattern correction, as compared to the conventional methods whereby OPC is performed step-wise to the mask pattern.

Furthermore, the first embodiment sorts the correction-subject units into S-OPC correction-subject units and R-OPC correction-subject units according to the magnitude of the width α and the distance β, to perform appropriate OPC to thus sorted correction-subject units. Therefore, it can not only improve the OPC processing speed as a whole but also secure the pattern accuracy after semiconductor ICs are formed using mask patterns which have undergone OPC processing.

Figure 7:
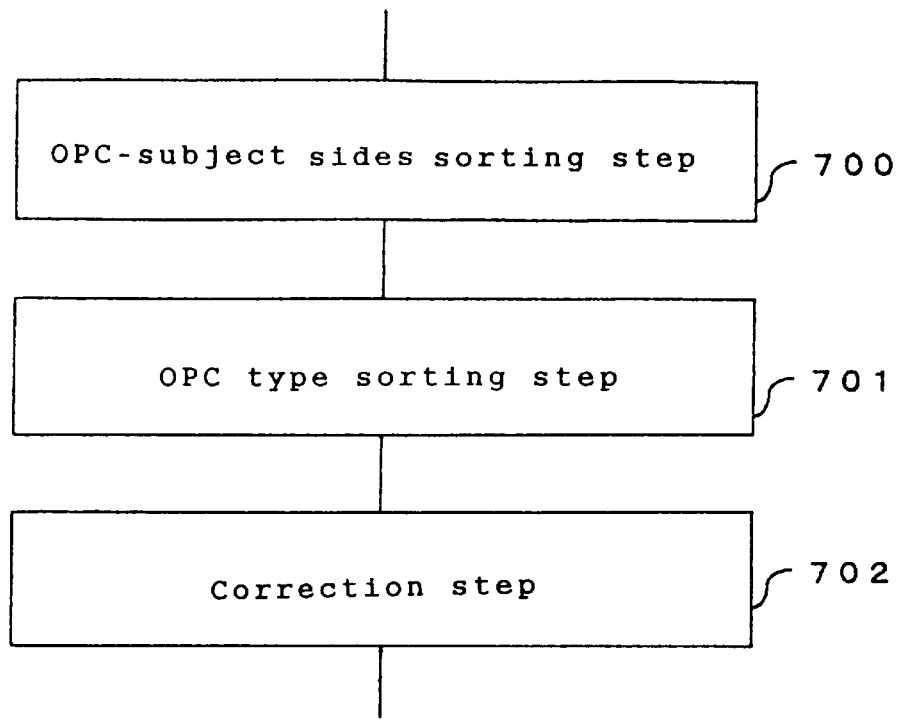
FIG. 7 is a flowchart showing a method for correcting a semiconductor-IC mask pattern according to the second embodiment of the invention.

With reference to FIG. 7, a correction method according to the second embodiment of the invention is described below. In FIG. 7, a numeral 700 indicates a step of sorting OPC-subject sides. At this step 700, for each of the pattern units which compose an input mask pattern, the system calculates its width α, the length of its component sides (hereinafter referred to as side length) γ, a distance β between one side and another proximate one, and an actually opposing length δ between one side and another proximate one (hereinafter called opposing length).

Although this embodiment has set the distance β to be a distance between mutually opposing sides, this distance β is essentially the same as that used in the first embodiment as indicating an inter-pattern unit distance β, so that in the second embodiment also, the same symbol β as that for the first embodiment is used.

Moreover, an angle β of the vertex of a pattern unit present at both ends of each side is calculated. Based on the results of calculating the above, the sides are all sorted out as those subject to OPC (hereinafter abbreviated as correction-subject sides) and those not subject to OPC (hereinafter abbreviated as subject sides).

A numeral 701 indicates a step of sorting OPC types, at which the correction-subject sides sorted at the step 700 are sorted out as those which undergo R-OPC and those which undergo S-OPC, based on the data of such f actors of sorting correction-subject sides as the side length γ, the distance β, the opposing length δ, the vertex angle θ, etc.

A numeral 702 indicates a step of correction, at which R-OPC or S-OPC is selectively performed on the correction-subject sides sorted out as correction-subject sides at the step 701, to output them.

Figure 8:
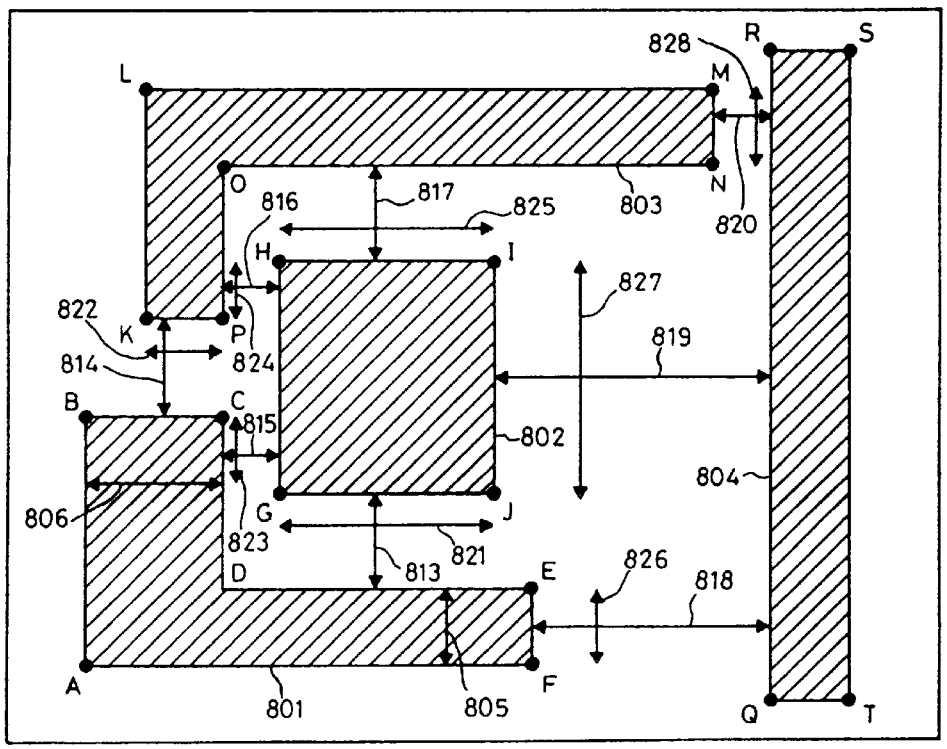
FIG. 8 shows an example of a mask pattern subject to correction according to the second embodiment of the invention.

In FIG. 8, numerals 801–804 indicate pattern units, numerals 805 and 806 indicate widths α of the pattern unit 801, characters A-F indicate vertices of the pattern unit 801, characters G-J indicate vertices of the pattern unit 802, characters K-P indicate vertices of the pattern unit 803, and characters Q-T indicate vertices of the pattern unit 804.

A numeral 813 indicates a distance $\beta$ between sides D-E and J-G, a numeral 814 indicates a distance $\beta$ between sides B-C and P-K, a numeral 815 indicates a distance $\beta$ between sides C-D and G-H, a numeral 816 indicates a distance $\beta$ between sides O-P and G-H, a numeral 817 indicates a distance $\beta$ between sides H-I and N-O, a numeral 818 indicates a distance $\beta$ between sides E-F AND Q-R, a numeral 819 indicates a distance $\beta$ between sides I-J and Q-R, and a numeral 820 indicates a distance $\beta$ between sides M-N and Q-R.

Also, a numeral 821 indicates an opposing length $\delta$ between sides G-J and D-E, a numeral 822 indicates an opposing length $\delta$ between sides K-P and B-C, a numeral 823 indicates an opposing length $\delta$ between sides C-D and G-H, a numeral 824 indicates an opposing length $\delta$ between sides O-P and G-H, a numeral 825 indicates an opposing length $\delta$ between sides H-I and N-O, a numeral 826 indicates an opposing length $\delta$ between sides E-F and Q-R, a numeral 827 indicates an opposing length $\delta$ between sides I-J and Q-R, and a numeral 828 indicates an opposing length $\delta$ between sides M-N and Q-R.

In FIG. 9, numerals 901–904 indicate pattern units after OPC processing, with each corresponding to the pattern units 801–804 shown in FIG. 8 respectively.

The operations are described below. Although the pattern unit 801 is exemplified in the following description, the principles of course hold true also with the other pattern units.

First, a mask pattern prepared beforehand is input at the step 700. At the step 700, first, for each (the pattern unit 801 exemplified here) of pattern units composing the mask pattern, the system calculates its widths 805 and 806, its side lengths (A-B), (B-C), (C-D), (D-E), (E-F), and (F-A), its distances 813, 814, and 818, and its opposing lengths 821, 822, and 826 as well as angles $\theta$ of vertices at the ends of each side.

Next, to decide whether the pattern unit 801 should be sorted out as a correction-subject unit or not, the system compares its widths 805 and 806 and the distances 813, 814, and 818 to the first and second values $\alpha$sh1 and $\beta$sh2 respectively. The description of this comparison operations is omitted here because they are the same as those for the first embodiment. In this embodiment, the width $\alpha$ and the distance $\beta$ are respectively compared to the first and second values $\alpha$sh1 and $\beta$sh2, thereby first sorting out correction-subject units. Here, the pattern unit 801 is supposed to have been sorted out as a correction-subject unit, before the following description is made.

Subsequently, each of sides which compose the pattern unit 801 thus sorted out as a correction-subject unit undergoes the following first and second comparison operations in order to decide whether it should be sorted out as a correction-subject side or not.

First, the first comparison operations are described as follows. The side lengths $\gamma$ of the sides A-B, B-C, C-D, D-E, E-F, and F-A are compared to the fifth value $\gamma$sh5, to sort out as correction-subject sides those sides whose length is not more than the fifth value $\gamma$sh5 and also whose angle of a vertex at the ends of the relevant side are 90 or 270 degree.

The angle $\theta$ is here employed as one sorting criterion for the following reason. That is, if its angle $\theta$ is 90 or 270 degrees, it means that a side is, in its shape of the pattern unit, positioned at the tip of a convex portion or at the bottom of a concave portion in a plane. Such a pattern unit positioned at any of these portions, if projected, will become subject to OPC because it is liable to have fluctuations in size because of the optical proximity effect. To guard against this, by sorting out such sides as meeting the above-mentioned conditions based on the angle $\theta$, correction-subject sides can be sorted out accurately.

Next, the second comparison operations are described as follows. First, the system compares the distances 813, 814, and 818 to the sixth value $\beta$sh6. The sixth value $\beta$sh6 is set at a value smaller than the second value $\beta$sh2 (i.e., $\beta$sh6<$\beta$sh2). With this, the system performs comparison between the opposing length $\delta$ and the seventh value $\delta$sh7 for those sides whose distance $\beta$ is smaller than the sixth value $\beta$sh6, to sort out and output those sides whose opposing length $\delta$ is not less than the seventh value $\delta$sh7 as correction-subject sides.

The sides are here sorted for the following reason. That is, such a side that has a considerable value of distance $\beta$ but a short opposing length $\delta$ is not liable to have fluctuations in size caused by the optical proximity effect, thus needing OPC less. To guard against this, by setting the sixth and seventh values $\beta$sh6 and $\delta$sh7 as threshold values of respectively the distance $\beta$ and the opposing length $\delta$, such sides as needing OPC little can be excluded.

With the above-mentioned comparison operations, as for the pattern unit 801, the sides B-C, C-D, D-E, and E-F are sorted out and output as correction-subject sides. Similarly, for those sides contained in the other pattern units 802–804 also, the sides G-H, H-I, J-G, M-N, N-O, O-P, P-K, Q-R, R-S, and T-Q are sorted out and output as correction-subject sides.

Next, at the step 701, for the correction-subject sides B-C, C-D, D-E, E-F, G-H, H-I, J-G, M-N, N-O, O-P, P-K, Q-R, R-S, and T-Q output from the step 700, the system performs the following third and fourth comparison operations on their side lengths $\gamma$, angles $\theta$, distances $\beta$, and opposing lengths $\delta$, to sort into S-OPC correction-subject sides and R-OPC correction-subject sides.

First, the third comparison operations are described as follows. The side length $\gamma$ of a correction-subject side is compared to the eighth value $\gamma$sh8. The eighth value $\gamma$sh8 is set at a value smaller than the fifth value $\gamma$sh5, which is a threshold value of the side length $\gamma$ (i.e., $\gamma$sh8<$\gamma$sh5). With this, if the side length $\gamma$ is smaller than the eighth value $\gamma$sh8 (i.e., $\gamma$<$\gamma$sh8<$\gamma$sh5), the relevant correction-subject side is sorted out as an S-OPC correction-subject side. If, on the other hand, the side length $\gamma$ is larger than the eighth value ($\gamma$sh8<$\gamma$<$\beta$sh5), the relevant correction-subject side is sorted out as an R-OPC correction-subject side.

Next, the fourth comparison operations are described as follows. First, the distance $\beta$ is compared to the ninth value $\beta$sh9. The ninth value $\beta$sh9 is set at a value smaller than the sixth value $\beta$sh6 (i.e., $\beta$sh9<$\beta$sh6).

Then, the system sorts out those correction-subject sides whose distance $\beta$ is larger than the ninth value $\beta$sh9 ($\beta$sh9<$\beta$<$\beta$sh6) as R-OPC correction-subject sides and output them.

If, conversely, the distance $\beta$ is smaller than the ninth value $\beta$sh9 ($\beta$<$\beta$sh9<$\beta$sh6), the relevant correction-subject sides undergo another comparison between their opposing length $\delta$ and the tenth value $\delta$sh10. The tenth value $\delta$sh10 is set at a value larger than the seventh value $\delta$sh7, which is a threshold value for that opposition length $\delta$ ($\delta$sh7<$\delta$<$\delta$sh10).

With this, the system sorts out those correction-subject sides whose opposition length $\delta$ is larger than the tenth value δsh10 (i.e., δsh7<δsh10<δ) as S-OPC correction-subject sides and output them. If, conversely, the opposition length δ is smaller than the tenth value δsh10 (δsh7<δ<δsh10), the relevant correction-subject sides are sorted out as R-OPC correction-subject sides and output.

If, as for the side B-C sorted out as a correction-subject side, its side length γ is larger than the eighth value γsh8 (i.e., γsh8<γ<γsh5), its distance 814 is larger than the ninth value βsh9 (βsh6<βsh9<β), and its opposition length 822 is larger than the tenth value δsh10 (δsh7<δsh10<δ), that side B-C is sorted out as an R-OPC correction-subject side and output. Similarly, the side D-E is also sorted out as an R-OPC correction-subject side and output.

As for the side C-D sorted out as a correction-subject side, if it is supposed that its distance 815 is smaller than the ninth value (i.e., βsh6<distance 815<βsh9) and its opposition length 823 is larger than the tenth value δsh10 (i.e., δsh7<δsh10<opposition length 823), that side C-D is sorted out as an S-OPC correction-subject side and output.

Similarly, if the side length γ of the side E-F sorted as a correction-subject side is smaller than the eleventh value (γ<γsh8<γsh5), that side E-F is sorted out as an S-OPC correction-subject side and output.

Similarly, for the other correction-subject sides G-H, H-I, J-G, M-N, N-Q, O-P, P-K, and Q-R also, the side length is compared to the eighth value γsh8 through the tenth value δsh10. With this, the system sorts out the sides G-H, M-N, O-P, P-K, Q-R, R-S, and T-Q as S-OPC correction-subject sides and the sides H-I, J-G, and N-O as R-OPC correction-subject sides and output them.

Next, the system inputs the correction-subject sides B-C, D-E, H-I, J-G, and N-O output from the step 701 at the step 702 and performs R-OPC on them. Similarly, the system inputs the correction-subject sides C-D, E-F, G-H, M-N, O-P, P-K, Q-R, R-S, and T-Q output from the step 701 at the step 702 and performs S-OPC on them. Then, the system combines the correction-subject sides which have undergone the respective OPC processing and the un-correction-subject sides for OPC, to output the pattern units 901–904.

Thus, the second embodiment sorts the sides contained in a pattern unit, based on their length, angle θ between them, distance β between them, opposition length δ, etc., thus deciding whether to perform S-OPC or R-OPC on each of the sides.

With this, in each of pattern units which compose a mask pattern, only those sides which affect the as-finished accuracy of a semiconductor IC can be sorted out as undergoing the optimal OPC, so that although it takes a little longer time to perform the OPC processing, the invention, as compared to the conventional methods, can suppress increases in the data amount and the processing time even with complicatedly-shaped mask patterns other than rectangles, thus improving the OPC accuracy.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A method for correcting a mask pattern for use in manufacturing of a semiconductor integrated circuit, which comprises the steps of:

sorting pattern units based on a shape and/or a relative positional relationship with a proximate pattern unit of said pattern units which includes said mask pattern;

performing pattern correction on pattern units selected from among said pattern units sorted at said sorting step;

said sorting step is a step for sorting out said pattern units as correction-subject units and subject units;

said correction step is a step for selectively performing pattern correction on said pattern units sorted out as said correction-subject units at said sorting step;

said sorting step is a step for further sorting pattern units sorted out as said correction-subject units, into groups suited for a plurality of pattern correction types respectively; and said correction step is a step for performing an optimal pattern correction on said correction-subject units which are sorted into said groups suited for said plurality of pattern correction types by said sorting step.

2. The method for correcting a mask pattern for use in manufacturing of a semiconductor integrated circuit according to claim 1, wherein said sorting step is a step for sorting said correction-subject units as said correction-subject units and said subject units based on a width of said pattern units.

3. The method for correcting a mask pattern for use in manufacturing of a semiconductor integrated circuit according to claim 2, wherein said sorting step is a step for sorting pattern units, of said pattern units, that have a width smaller than a predetermined value, as said correction-subject units.

4. The method for correcting a mask pattern for use in manufacturing of a semiconductor integrated circuit according to claim 1, wherein said sorting step is a step for sorting said pattern units into said correction-subject units and said subject units based on a distance between mutually proximate pattern units.

5. The method for correcting a mask pattern for use in manufacturing of a semiconductor integrated circuit according to claim 4, wherein said sorting step is a step for pattern units, of said pattern units, that have a distance with a proximate pattern unit smaller than a predetermined value, as said correction-subject units.

6. The method for correcting a mask pattern for use in manufacturing of a semiconductor integrated circuit according to claim 1, wherein said sorting step is a step for sorting said correction-subject units into said groups based on a width of said correction-subject units.

7. The method for correcting a mask pattern for use in manufacturing of a semiconductor integrated circuit according to claim 1, wherein said sorting step is a step for sorting said correction-subject units into said groups based on a distance between said correction-subject units and a proximate pattern unit.

8. The method for correcting a mask pattern for use in manufacturing of a semiconductor integrated circuit according to claim 1, where pattern correction is optical proximity effect correction.

9. The method for correcting a mask pattern for use in manufacturing of a semiconductor integrated circuit according to claim 1, wherein said plurality of pattern correction methods are a simulation-based optical proximity effect correction method and a rule-based optical proximity effect correction method.

10. A method for correcting a mask pattern for use in manufacturing of a semiconductor integrated circuit, which comprises the steps of:

sorting sides which are elements that compose each of pattern units which compose a mask pattern, based on a shape and/or a relative positional relationship of said side with a proximate side;

selectively performing pattern correction on said sides sorted at said sorting step;

said sorting step is a step for sorting out said sides as correction-subject units and subject units;

said correction step is a step for selectively performing pattern correction on sides which are sorted as correction-subject sides at said sorting step;

said sorting step is a step for further sorting pattern units sorted out as said correction-subject units, into groups suited for a plurality of types of pattern correction; and said correction step is a step for performing optimal pattern correction on said correction-subject units sorted into said groups of said plurality of types of pattern correction.

11. The method for correcting a mask pattern for use in manufacturing of a semiconductor integrated circuit according to claim 10, wherein said sorting step is a step for sorting out sides as said correction-subject sides and said subject sides based on a length of said sides and an angle of a unit vertex at both ends of said sides.

12. The method for correcting a mask pattern for use in manufacturing of a semiconductor integrated circuit according to claim 10, wherein said sorting step is a step for sorting out, as said correction-subject sides, said sides that a length smaller than a predetermined value and also that has an angle of 90 or 270 degrees of units vertices at both ends of said sides.

13. The method for correcting a mask pattern for use in manufacturing of a semiconductor integrated circuit according to claim 10, wherein said sorting step is a step for sorting out sides as said correction-subject sides and said subject sides based on a distance between adjacent sides and a length actually opposing between mutually proximate sides.

14. The method for correcting a mask pattern for use in manufacturing of a semiconductor integrated circuit according to claim 13, wherein said sorting step is a step for sorting out, as said correction-subject sides, sides that has said distance smaller than a predetermined value and said opposing length larger than another predetermined value.

15. The method for correcting a mask pattern for use in manufacturing of a semiconductor integrated circuit according to claim 13, wherein said sorting step is a step for sorting said correction-subject sides into said groups based on a length of said correction-subject sides.

16. The method for correcting a mask pattern for use in manufacturing of a semiconductor integrated circuit according to claim 13, wherein said sorting step is a step for sorting said correction-subject units into said groups based on a distance between adjacent sides and a length actually opposing between adjacent sides.

17. The method for correcting a mask pattern for use in manufacturing of a semiconductor integrated circuit according to claim 10, wherein said pattern correction is optical proximity effect correction.

18. The method for correcting a mask pattern for use in manufacturing of a semiconductor integrated circuit according to claim 10, wherein said plurality of pattern correction methods are a simulation-based optical proximity effect correction method and a rule-based optical proximity effect correction method.

* * * * *

UNITED STATES PATENT AND TRADEMARK OFFICE
CERTIFICATE OF CORRECTION

PATENT NO. : 6,168,891B1
DATED : January 2, 2001
INVENTOR(S) : Hidenori Shibata

Page 1 of 1

It is certified that error appears in the above-identified patent and that said Letters Patent is hereby corrected as shown below:

<u>Column 13,</u>
Lines 38-39 change "un-correction-subject" to --subject--.

Signed and Sealed this

Seventeenth Day of July, 2001

*Attest:*

NICHOLAS P. GODICI
*Attesting Officer*    *Acting Director of the United States Patent and Trademark Office*